(12) United States Patent
Jang

(10) Patent No.: US 9,001,592 B2
(45) Date of Patent: Apr. 7, 2015

(54) SEMICONDUCTOR MEMORY DEVICE AND METHOD OF OPERATING THE SAME

(75) Inventor: Yoon Soo Jang, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 308 days.

(21) Appl. No.: 13/605,963

(22) Filed: Sep. 6, 2012

(65) Prior Publication Data

US 2013/0182521 A1    Jul. 18, 2013

(30) Foreign Application Priority Data

Jan. 18, 2012    (KR) .......................... 10-2012-0005721

(51) Int. Cl.
  *G11C 16/04*     (2006.01)
  *G11C 16/16*     (2006.01)
  *H01L 27/115*    (2006.01)
  *H01L 29/792*    (2006.01)

(52) U.S. Cl.
  CPC ............. *G11C 16/0483* (2013.01); *G11C 16/16* (2013.01); *H01L 27/1157* (2013.01); *H01L 27/11582* (2013.01); *H01L 29/7926* (2013.01)

(58) Field of Classification Search
  USPC ........................... 365/185.29, 185.33, 185.17
  See application file for complete search history.

(56) References Cited

U.S. PATENT DOCUMENTS

| | | | |
|---|---|---|---|
| 7,924,622 B2 * | 4/2011 | Lee et al. .................... | 365/185.2 |
| 8,437,199 B2 * | 5/2013 | Park ......................... | 365/185.29 |
| 2009/0279360 A1 * | 11/2009 | Lee et al. .................. | 365/185.17 |

* cited by examiner

*Primary Examiner* — Vu Le
(74) *Attorney, Agent, or Firm* — IP & T Group LLP

(57) ABSTRACT

A semiconductor memory device is operated by forming channels in a cell string including a plurality of memory cells and coupled between a bit line and a source line, applying first and second erase voltages having different levels to the channels through the bit line and the source line, respectively, and applying a first word line voltage to at least one word line among word lines coupled to the plurality of memory cells.

19 Claims, 7 Drawing Sheets

| Selected word line | Vsel |
|---|---|
| Unselected word line | Vusel |
| Source line | Vers2 |
| Bit line | Vers1 |

FIG. 11
| Selected word line | Vsel |
| --- | --- |
| Unselected word line | Vusel |
| Source line | Vers1 |
| Bit line | Vers2 |
FIG. 12
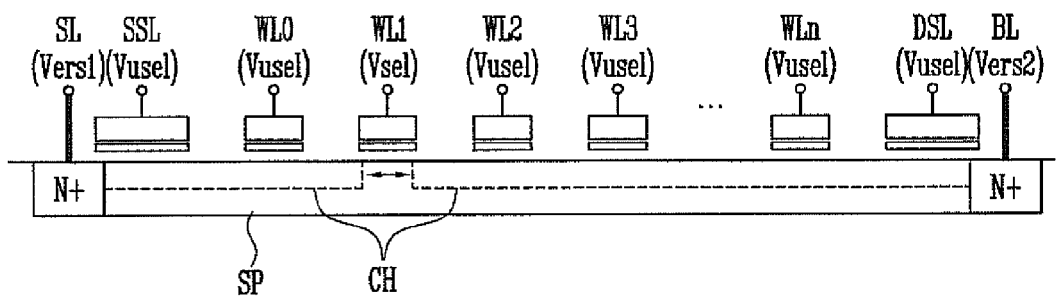
FIG. 13
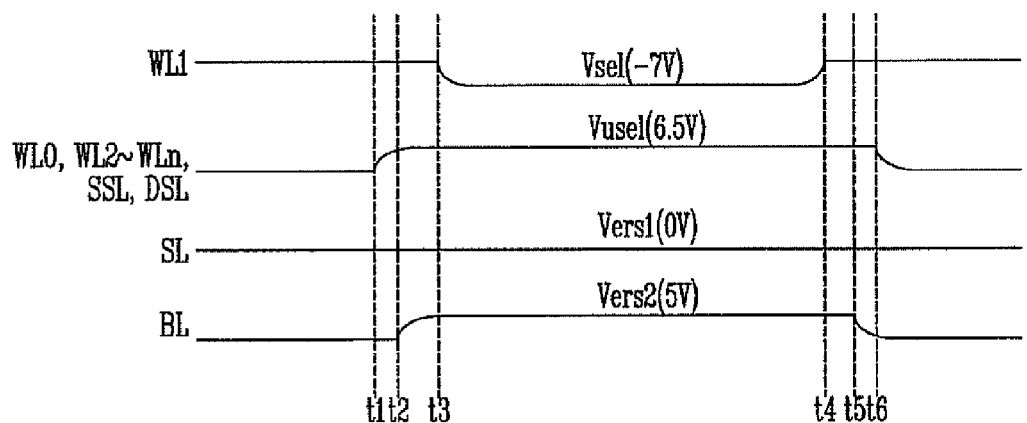

SEMICONDUCTOR MEMORY DEVICE AND METHOD OF OPERATING THE SAME

CROSS-REFERENCE TO RELATED APPLICATION

Priority is claimed to Korean patent application number 10-2012-0005721 filed on Jan. 18, 2012, the entire disclosure of which is incorporated herein by reference in its entirety.

BACKGROUND

1. Field of Invention

An embodiment of the present invention relates to a semiconductor memory device and, more particularly, to a semiconductor memory device including a plurality of memory cells.

2. Description of Related Art

A semiconductor memory is a storage device that is realized using a semiconductor such as silicon (Si), germanium (Ge), gallium arsenide (GaAs) or indium phosphide (InP). A semiconductor memory is divided into two types: volatile memory and nonvolatile memory.

Volatile memory is a memory that may lose its stored data when power supply is off. Examples of the volatile memory may include Static RAM (SRAM), Dynamic RAM (DRAM) and Synchronous DRAM (SDRAM). Non-volatile memory is a memory that may retain the stored data even when not powered. Examples of the non-volatile memory may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM) and Ferroelectric RAM (FRAM). Flash memory is divided into NOR type and NAND type.

In order to have a higher integration degree of semiconductor memory devices, research has been conducted on semiconductor memory devices having a three-dimensional (3-D) array structure. A semiconductor memory device with a 3-D array structure is operated in a different manner from a semiconductor memory device with a two-dimensional array structure. Therefore, it is important to ensure characteristics of a semiconductor memory device having a 3-D array structure.

BRIEF SUMMARY

An embodiment of the present invention relates to a semiconductor memory device improving reliability of an erase operation and a method of operating the same.

A method of operating a semiconductor memory device according to an embodiment of the present invention includes forming channels in a cell string including a plurality of memory cells stacked over a substrate, wherein the cell string is coupled between a bit line and a source line, applying first and second erase voltages having different levels to the channels through the bit line and the source line, respectively, and applying a first word line voltage to at least one word line among word lines coupled to the plurality of memory cells.

The forming of the channels in the cell string may include applying a second word line voltage to other word lines than the at least one word line to form the channels.

The forming channels in the cell string may further include applying a second word line voltage to a drain select transistor disposed between the memory cells and the bit line, and electrically coupling the cell string to the bit line.

The forming channels in the cell string may further include applying the second word line voltage to a source select transistor disposed between the memory cells and the source line, and coupling the cell string to the source line.

A semiconductor memory device according to another embodiment of the present invention includes a memory cell array including a cell string coupled between a bit line and a source line, wherein the cell string comprises a plurality of memory cells stacked over a substrate, a voltage generator configured to generate first and second erase voltages having different levels, and a peripheral circuit configured to form channels in the cell string and apply the first and second erase voltages to the channels through the bit line and the source line, respectively, during an erase operation.

A method of operating a semiconductor memory device according to further embodiment of the present invention includes applying a first word line voltage to at least one of a plurality of memory cells stacked between a bit line and a source line over a substrate, applying a second word line voltage higher than the first word line voltage to the other memory cells, and applying first and second erase voltages having different levels to the bit line and the source line, respectively.

BRIEF DESCRIPTION OF THE DRAWINGS

FIG. 11 is a table showing another example of bias conditions of voltages applied to row lines of FIG. 1;

FIG. 12 is a diagram illustrating an erase operation performed in the cell string of FIG. 3 (or 5) when the voltages satisfying the bias conditions of FIG. 11 are applied thereto; and FIG. 13 is a timing diagram illustrating the voltages applied to the cell string under the bias conditions of FIG. 11.

DESCRIPTION OF EMBODIMENTS

Hereinafter, various embodiments of the present invention will be described in detail with reference to the accompanying drawings. The figures are provided to enable those of ordinary skill in the art to make and use the present invention according to the embodiments of the present invention.

Furthermore, 'connected/coupled' represents that one component is directly or indirectly (through other components) coupled to another component. In this specification, a singular form may include a plural form as long as it is not specifically mentioned in a sentence. Furthermore, 'include/comprise' or 'including/comprising' used in the specification represents that one or more components, steps, operations, or elements may be further added.

Figure 1:
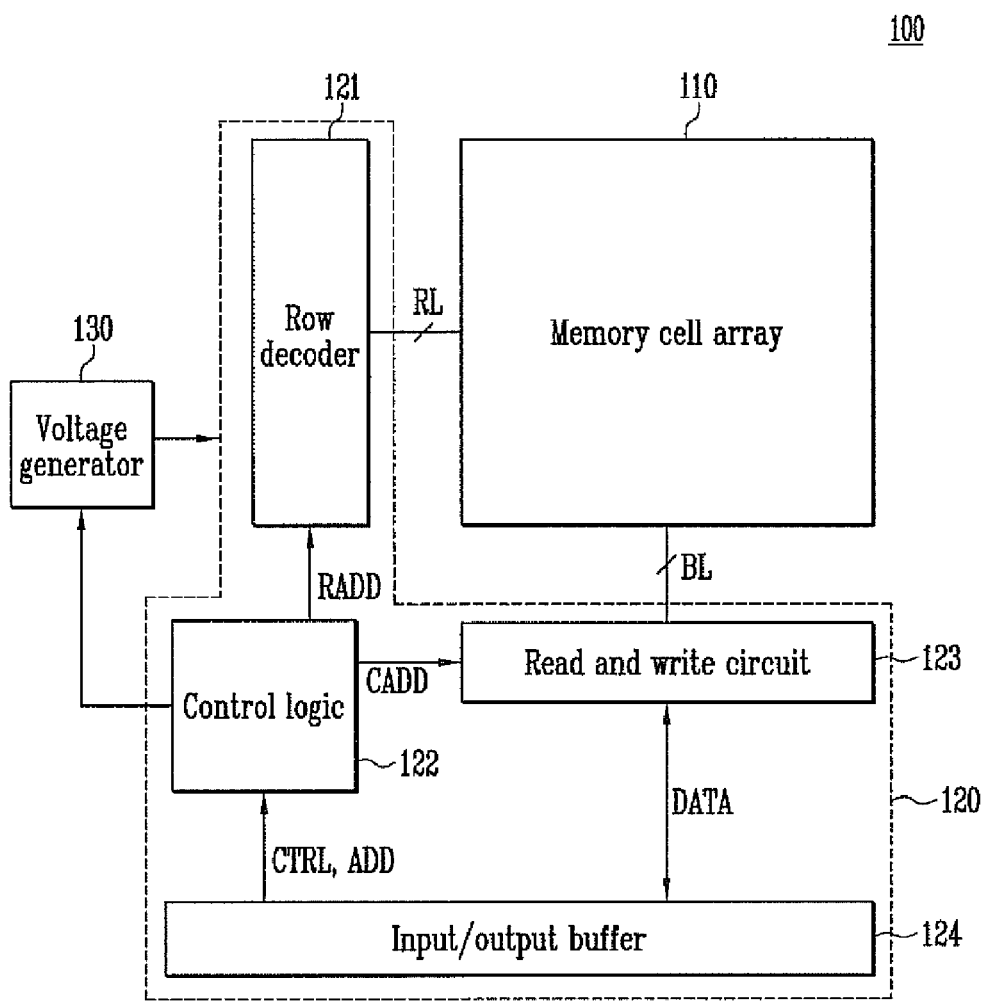
FIG. 1 is a block diagram of a semiconductor memory device according to an embodiment of the present invention.

FIG. 1 is a block diagram of a semiconductor memory device 100 according to an embodiment of the present invention.

Referring to FIG. 1, the semiconductor memory device 100 may include a memory cell array 110, a peripheral circuit 120 and a voltage generator 130. The memory cell array 110 may be coupled to a row decoder 121 through row lines RL and to a read and write circuit 123 through bit lines BL. The row lines RL may include source select lines, word lines and drain select lines, which will be described below with reference to FIGS. 3 to 6.

The memory cell array 110 may include a plurality of memory blocks. Each of the memory blocks may include a plurality of cell strings. Each of the cell strings may include a plurality of non-volatile memory cells that are stacked over a substrate. For example, each of the plurality of non-volatile memory cells may store one or more bits. The memory cell array 110 will be described below in more detail with reference to FIGS. 2 to 7.

The peripheral circuit 120 may be coupled to the memory cell array 110 and the voltage generator 130. The peripheral circuit 120 may include the row decoder 121, a control logic 122, a read and write circuit 123 and an input/output circuit 124.

The peripheral circuit 120 is configured to form channels in each of the cell strings of the memory cell array 110, apply first and second erase voltages to the channels through a bit line and a source line, respectively, and apply a selected word line voltage to at least one of the row lines RL to thus perform an erase operation.

The row decoder 121 may be coupled to the memory cell array 110 and the control logic 122. The row decoder 121 is configured to operate under control of the control logic 122. The row decoder 121 may receive a plurality of voltages having different levels from the voltage generator 130.

The row decoder 121 may receive a row address RADD from the control logic 122. The row decoder 121 is configured to decode the row address RADD. In addition, the row decoder 121 is configured to select at least one of the word lines by applying the voltages from the voltage generator 130 onto the row lines RL in response to the decoded row address RADD. In other words, the word lines may be selected or not in response to the row address RADD. For example, the row decoder 121 may apply a selected word line voltage and an unselected word line voltage to a selected word line and unselected word lines, respectively, during the erase operation. The row decoder 121 may apply the unselected word line voltage to the drain select line and the source select line.

For example, the row address RADD may include a block address. Here, the row decoder 121 may be configured to decode the block address and select a memory block of the memory cell array 110 in response to the decoded block address.

The control logic 122 may be coupled to the row decoder 121, the read and write circuit 123, the input/output buffer 124 and the voltage generator 130. The control logic 122 may receive a control signal CTRL from the input/output buffer 124 and is configured to control the general operation of the semiconductor memory device 100 in response to the control signal CTRL. When receiving the control signal CTRL indicating an erase operation, the control logic 122 may control the semiconductor memory device 100 to perform the erase operation.

The control logic 122 may receive an address ADD from the input/output buffer 124. The control logic 122 may transfer the row address RADD of the address ADD to the row decoder 121 and transfer a column address CADD to the read and write circuit 123.

The read and write circuit 123 may be coupled to the memory cell array 110 through the bit lines BL. The read and write circuit 123 is configured to operate under control of the control logic 122. The read and write circuit 123 is configured to exchange data DATA with the input/output buffer 124.

During a program operation, the read and write circuit 123 may receive the data DATA to be programmed from the input/output buffer 124 and control voltages of the bit lines BL to program memory cells of the selected word line with the received data DATA.

During a read operation, the read and write circuit 123 may decode the column address CADD received from the control logic 122. The read and write circuit 123 may read the data DATA stored in the memory cells of the selected word line and transfer data corresponding to the decoded column address CADD, among the read data DATA, to the input/output buffer 124.

During an erase operation, the read and write circuit 123 may receive an erase voltage to be applied to the bit lines BL from the voltage generator 130. In addition, the read and write circuit 123 may apply the erase voltage onto the bit lines BL.

For example, the read and write circuit 123 may include components such as page buffers (or page registers), a column decoder configured to decode the column address CADD and a column selector. In another example, the read and write circuit 123 may include components such as a sense amplifier, a write driver, a column decoder configured to decode the column address CADD and a column selector.

The input/output buffer 124 may be coupled to the control logic 122 and the read and write circuit 123. The input/output buffer 124 may receive the control signal CTRL and the address ADD, that are externally input, and transfer the control signal CTRL and the address ADD to the control logic 122. Unlike the row address RADD and the column address CADD described in connection with FIG. 1, for example, the row address RADD of the address ADD may be directly transferred to the row decoder 121 from the input/output buffer 124, and the column address CADD may be directly transferred to the read and write circuit 123 from the input/output buffer 124. Also, the row address RADD and the column address CADD may be transferred to the row decoder 121 and the read and write circuit 123 by using various methods.

The input/output buffer 124 may exchange the data DATA with the outside. During the program operation, the input/output buffer 124 may transfer the data DATA, externally input, to the read and write circuit 123. During the read operation, the input/output buffer 124 may externally transfer the data DATA received from the read and write circuit 123.

The voltage generator 130 may be coupled to the peripheral circuit 120. The voltage generator 130 is configured to operate under control of the control logic 122. The voltage generator 130 is configured to generate high voltages. For example, the voltage generator 130 may include a plurality of pumping capacitors. The voltage generator 130 may be configured to generate high voltages of various levels by using the plurality of pumping capacitors.

During the erase operation, the voltage generator 130 may generate the selected word line voltage to be applied to the selected word line and the unselected word line voltage to be applied to the unselected word lines, under control of the control logic 122. The selected word line voltage and the unselected word line voltage may be applied onto the row lines RL by the row decoder 121.

During the erase operation, the voltage generator 130 may generate erase voltages to be applied to a bit line and a source line, respectively, under control of the control logic 122. The erase voltage to be applied to the bit line may be applied to the read and write circuit 123. The erase voltage to be applied to the source line may be directly applied to the source line from the voltage generator 130 or be applied to the source line from the voltage generator 130 through the row decoder 121. Further details of the voltage generator 130 during the erase operation will be described below with reference to FIG. 8.

Figure 2:
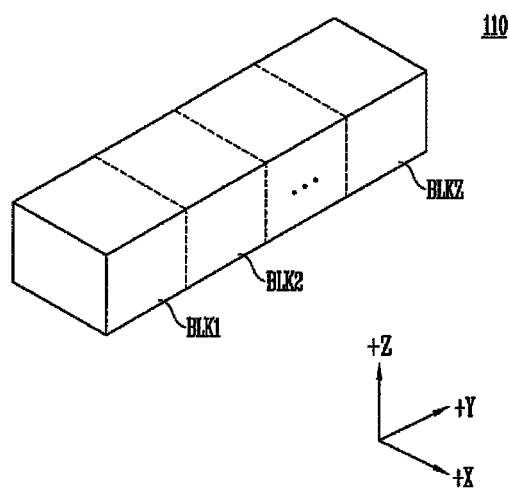
FIG. 2 is a block diagram of an example of a memory cell array shown in FIG. 1.

FIG. 2 is a block diagram of an example of the memory cell array 110 of FIG. 1.

Referring to FIG. 2, the memory cell array 110 may include a plurality of memory blocks BLK1 to BLKz. Each of the memory blocks may have a three-dimensional structure. Each memory block may include structures extending in an X direction, a Y direction and a Z direction. Each of the memory blocks may include a plurality of cell strings that are arranged in first and third directions. Each of the cell strings may be a structure that extends in a second direction. Each of the cell strings is described below in more detail with reference to FIGS. 3 to 6.

Figure 3:
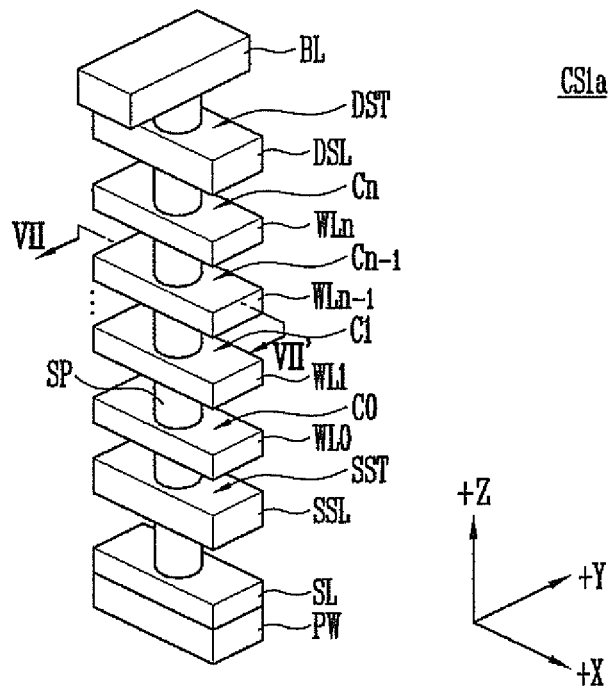
FIG. 3 is a view of a first example of one of cell strings included in each memory block shown in FIG. 2.
Figure 4:
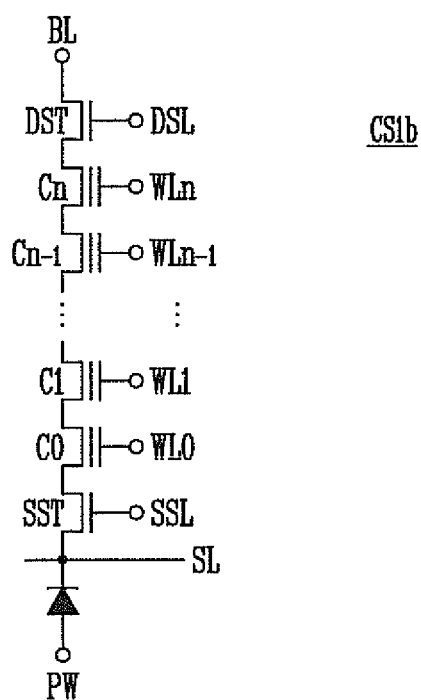
FIG. 4 is a diagram illustrating an equivalent circuit of the cell string of FIG. 3.

FIG. 3 is a diagram of a first example CS1a of one of the cell strings included in each memory block shown in FIG. 2. FIG. 4 is a diagram illustrating an equivalent circuit CS1b of the cell string CS1a of FIG. 3.

Referring to FIGS. 3 and 4, a source line SL may be formed over a semiconductor substrate in which a P well PW is formed. A vertical channel layer SP may be formed on the source line SL. A top portion of the vertical channel layer SP may be coupled to the bit line BL. For example, the vertical channel layer SP may be formed of polysilicon. A plurality of conductive layers SSL, WL0 to WLn and DSL may surround the vertical channel layer SP at different heights of the vertical channel layer SP. A plurality of layers including a charge trap layer may be formed over a surface of the vertical channel layer SP and between the vertical channel layer SP and the plurality of conductive layers SSL, WL0 to WLn and DSL.

The plurality of conductive layers SSL, WL0 to WLn and DSL may be used for different purposes depending on their heights. The lowermost conductive layer may be used as a source select line SSL, while the uppermost conductive layer may be used as a drain select line DSL. The other conductive layers between the select lines SSL and DSL may be provided as word lines WL0 to WLn. In other words, the plurality of conductive layers SSL, WL0 to WLn and DSL may be arranged in a direction (Z direction) substantially perpendicular to the substrate, and the vertical channel layer SP passing through the plurality of conductive layers SSL, WL0 to WLn and DSL may extend between the bit line BL and the source line SL formed over the substrate.

A drain select transistor DST may be provided at a position in which the uppermost conductive layer DSL surrounds the vertical channel layer SP. A source select transistor SST may be provided at a position in which the lowermost conductive layer SSL surrounds the vertical channel layer SP. A plurality of memory cells C0 to Cn may be formed at positions in which the intermediate conductive layers (WL0 to WLn) surround the vertical channel layer SP.

With the structure described in connection with FIGS. 3 and 4, a cell string CS1 may include the source select transistor SST, the memory cells C0 to Cn and the drain select transistor DST that are arranged between the source line SL and the bit line BL.

For example, at least one of the memory cells C0 to Cn may operate as a dummy memory cell. The dummy memory cell may be provided to prevent threshold voltage interference from occurring between the memory cells C0 to Cn.

Figure 5:
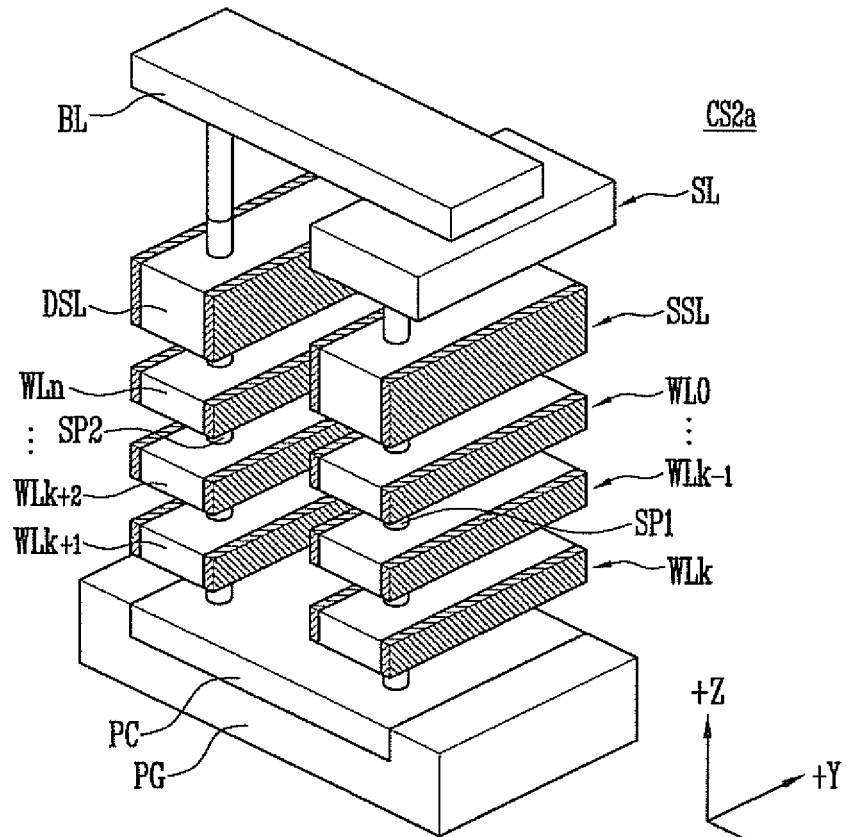
FIG. 5 is a view of a second example of one of cell strings included in each memory block shown in FIG. 2.
Figure 6:
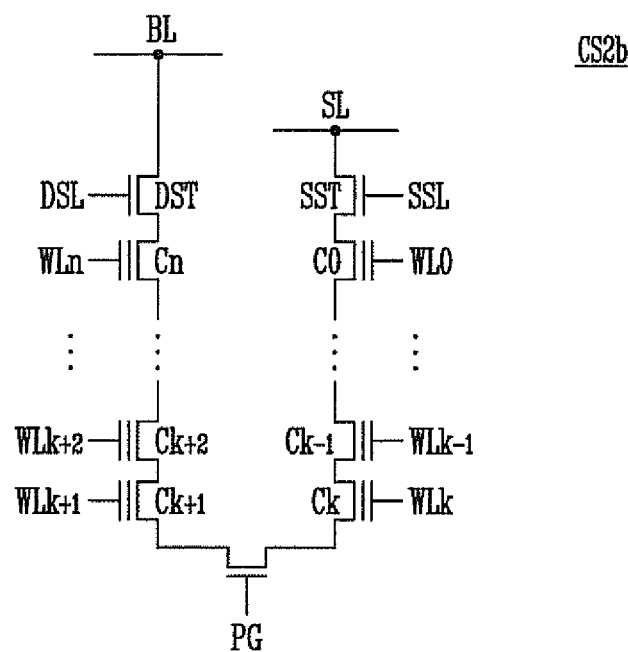
FIG. 6 is a diagram illustrating an equivalent circuit of the cell string shown in FIG. 5.

FIG. 5 is a view of a second example CS2a of one of the cell strings included in each memory block of FIG. 2. FIG. 6 is a diagram illustrating an equivalent circuit CS2b of the cell string CS2a of FIG. 5.

Referring to FIGS. 5 and 6, a pipe gate PG that has a recessed portion may be formed over the semiconductor substrate, and a pipe channel layer PC may be formed in the recessed portion of the pipe gate PG. Vertical channel layers SP1 and SP2 may be provided on the pipe channel layer PC. A top portion of the first vertical channel layer SP1 may be coupled to the source line SL, and a top portion of the second vertical channel layer SP2 may be coupled to the bit line BL. The vertical channel layers SP1 and SP2 may be formed of polysilicon.

A plurality of conductive layers SSL and WL0 to WLk may surround the first vertical channel layer SP1 at different heights of the first vertical channel layer SP1. In addition, a plurality of conductive layers WLk+1 to WLn and DSL may surround the second vertical channel layer SP2 at different heights of the second vertical channel layer SP2. A plurality of layers including a charge trap layer may be provided over surfaces of the vertical channel layers SP1 and SP2 and a surface of the pipe channel layer PC. In other words, the plurality of layers may be formed between the vertical channel layers SP1 and SP2 and the conductive layers SSL, WL0 to WLn and DSL and between the pipe channel layer PC and the pipe gate PG.

The uppermost conductive layer that surrounds the first vertical channel layer SP1 may be provided as the source select line SSL. The conductive layers under the source select line SSL may be provided as word lines WL0 to WLk. The uppermost conductive layer that surrounds the second vertical channel layer SP2 may be provided as the drain select line DSL. The conductive layers under the drain select line DSL may be provided as word lines WLn to WLk+1.

In other words, the plurality of conductive layers SSL, WL0 to WLn and DSL may be stacked in the direction Z direction substantially perpendicular to the substrate, and one pair of vertical channel layers SP1 and SP2 coupled through the pipe gate PG may pass through the plurality of conductive layers SSL, WL0 to WLn and DSL. In addition, the first vertical channel layer SP1 that passes through the conductive layers SSL and WL0 to WLk may be coupled between the source line SL and the pipe channel layer PC. The second vertical channel layer SP2 that passes through the conductive layers DSL and WLn to WLk+1 may be coupled between the bit line BL and the pipe channel layer PC.

The source select transistor SST may be provided at a position in which the uppermost conductive layer SSL surrounds the first vertical channel layer SP1. Memory cells C0 to Ck may be formed at positions in which the conductive layers WL0 to WLk surround the first vertical channel layer SP1. The drain select transistor DST may be formed at a position in which the uppermost conductive layer DSL surrounds the second vertical channel layer SP2. In addition, memory cells Ck+1 to Cn may be formed at positions in which the conductive layers WLn to WLk+1 surround the second vertical channel layer SP2.

With the structure described in connection with FIGS. 5 and 6, a cell string CS2 may include the source select transistor SST and the memory cells C0 to Ck that are arranged between the source line SL and the pipe channel layer PC in the direction substantially perpendicular to the substrate and the drain select transistor DST and the memory cells Ck+1 to Cn that are arranged between the bit line BL and the pipe channel layer PC in the direction substantially perpendicular to the substrate.

For example, at least one of the memory cells C0 to Cn may operate as a dummy memory cell. The dummy memory cell may be provided to prevent threshold voltage interference from occurring between the memory cells C0 to Cn.

Figures 7, 8:
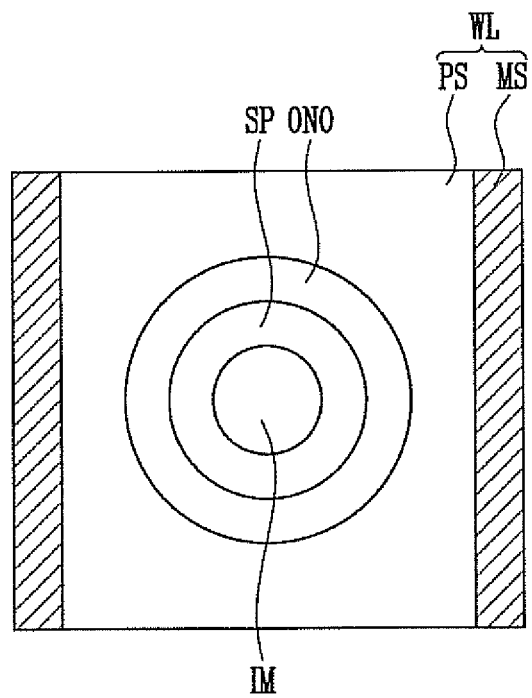
FIG. 7 is a cross-sectional view of the cell string taken along line VII-VII' shown FIG. 3.
FIG. 8 is a table showing an example of bias conditions of voltages applied to row lines shown FIG. 1.

FIG. 7 is a cross-sectional view of the cell string of FIG. 3 taken along line VII-VII'. Referring to FIG. 7, the vertical channel layer SP may have a cylindrical shape. At the center axis of the vertical channel layer SP, internal materials IM may be further included. The internal materials IM may comprise air gaps or an insulating material such as silicon oxide. The vertical channel layer SP may comprise a semiconductor layer. The vertical channel layer SP may be formed of a semiconductor material that has substantially the same conductivity as the substrate (e.g., a polysilicon layer doped with 5-valence impurities). In another example, the vertical channel layer SP may be formed of an intrinsic semiconductor.

A stacked layer ONO that comprises a charge trap layer may surround the vertical channel layer SP. The stacked layer ONO may comprise a tunneling insulating layer, a charge trap layer and a blocking insulating layer that are sequentially stacked on the vertical channel layer SP. The tunneling insulating layer may comprise an oxide layer, the charge trap layer may comprise a nitride layer and the blocking insulating layer may comprise an oxide layer or an insulating layer having a higher dielectric constant than the nitride layer. A conductive layer WL that is provided as a word line may surround the vertical channel layer SP. For example, the conductive layer WL may comprise a polysilicon layer PS and metal silicide MS.

Each of the memory cells included in the cell string CS2 shown in FIG. 5 may be configured in substantially the same manner as described in connection with FIG. 7.

As described in connection with FIGS. 2 to 7, the memory cells of the memory cell array 110 (see FIG. 1) may not be directly coupled to the substrate and be coupled to the substrate through the vertical channel layer SP. During an erase operation, a high voltage may be applied to the memory cell (e.g., C1) through the substrate and the vertical channel layer SP and a ground voltage may be applied through the word line (e.g., WL1). Electrons injected from, for example, the word line WL1, may be trapped in the charge trap layer of the stacked layer ONO (see FIG. 7) due to a large voltage difference between the vertical channel layer SP and the word line WL1. As a result, the memory cells may be programmed in error. For example, back-tunneling may occur.

According to an embodiment of the present invention, during an erase operation, first and second erase voltages may be applied to the vertical channel layer SP through the bit line BL and the source line SL, respectively, which will be described below in more detail with reference to FIG. 8.

FIG. 8 is a table showing bias conditions of voltages applied to the row lines RL of FIG. 1. Referring to FIGS. 3, 5 and 8, a selected word line voltage Vsel may be applied to a selected word line, and an unselected word line voltage Vusel may be applied to unselected word lines. The unselected word line voltage Vusel may be high enough to form channels in the vertical channel layer SP of a cell string CS.

The selected word line voltage Vsel may be lower than the unselected word line voltage Vusel. For example, the selected word line voltage Vsel may be lower than a ground voltage.

The selected word line voltage Vsel may be low enough to erase data from memory cells coupled to the selected word line.

First and second erase voltages Vers1 and Vers2 may be applied to the bit line BL and the source line SL, respectively. The first and second erase voltages Vers1 and Vers2 may have different levels. For example, the first erase voltage Vers1 may be a ground voltage, and the second erase voltage Vers2 may be higher than the ground voltage. In another example, the first erase voltage Vers1 may be higher than the ground voltage, and the second erase voltage Vers2 may be the ground voltage.

Figure 9:
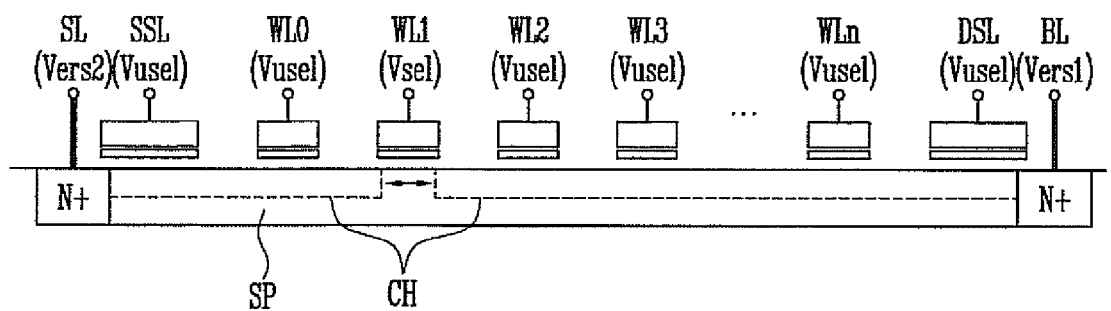
FIG. 9 is a diagram illustrating an erases operation performed in the cell string shown in FIGS. 3 (and 5) when the voltages satisfying the bias conditions of FIG. 8 are applied thereto.

FIG. 9 is a diagram illustrating an erase operation performed in the cell string CS (see FIGS. 3 and 5) when the voltages satisfying the bias conditions of FIG. 8 are applied thereto. Hereinafter, in connection with FIGS. 9 and 10, it is described as an example that a first word line WL1 is selected and the rest of the word lines WL0 and WL2 to WLn are not selected.

Referring to FIG. 9, the unselected word line voltage Vusel may be applied to the unselected word lines WL0 and WL2 to WLn. When the unselected word line voltage Vusel, which is a high voltage, is applied, channels CH may be formed in the vertical channel layer SP. For example, the channels CH may be formed in the vertical channel layer SP at positions corresponding to memory cells of the unselected word lines WL0 and WL2 to WLn.

The selected word line voltage Vsel may be applied to the selected word line WL1. When the selected word line voltage Vsel, which is a low voltage, is applied, a channel may not be formed in the vertical channel layer SP at a position corresponding to a memory cell of the selected word line WL1. The channels CH may be disconnected in the vertical channel layer SP at the position corresponding to the memory cell of the selected word line WL1. The selected word line voltage Vsel may be a low voltage to electrically separate the memory cell of the selected word line WL1 from other memory cells. In addition, the selected word line voltage Vsel may be low enough to erase data of the memory cell coupled to the selected word line WL1.

The unselected word line voltage Vusel may be applied to the source select line SSL and the drain select line DSL. The source select line SSL and the drain select line DSL may be coupled to the source select transistor SST (see FIGS. 3 and 5) and the drain select transistor DST (see FIGS. 3 and 5), respectively. When the unselected word line voltage Vusel is applied, the channels CH may be formed in the vertical channel layer SP at positions corresponding to the source select transistor SST and the drain select transistor DST. The drain select transistor DST and the source select transistor SST may be turned on. Therefore, the channels CH may be electrically coupled to the bit line BL or the source line SL. FIG. 9 illustrates that the unselected word line voltage Vusel is applied to the source select transistor SST and the drain select transistor DST. However, the present invention is not limited thereto, and other voltages may be applied to the drain select transistor DST and the source select transistor SST in order to turn on the drain select transistor DST and the source select transistor SST.

The first erase voltage Vers1 may be applied through the bit line BL. The channels CH coupled to the bit line BL among the channels CH formed in the vertical channel layer SP may have the first erase voltage Vers1. The second erase voltage Vers2 may be applied through the source line SL. The channels CH coupled to the source line SL, among the channels CH formed in the vertical channel layer SP, may have the second erase voltage Vers2.

The channels CH may be disconnected in the vertical channel layer SP at the position corresponding to the memory cell of the selected word line WL1. A lateral field may be generated in the vertical channel layer SP at the position corresponding to the memory cell of the selected word line WL1 due to the first and second erase voltages Vers1 and Vers2. The lateral field may result in generation of hot holes in a region adjacent to the memory cell of the selected word line WL1. In addition, the selected word line voltage Vsel applied to the selected word line WL1 may cause the hot holes to be trapped in the charge trap layer of the memory cell of the selected word line WL1. As a result, the data stored in the memory cell of the selected word line WL1 may be erased.

According to an embodiment of the present invention, the data stored in the memory cell of the selected word line WL1 may be efficiently erased by applying the first and second erase voltages Vers1 and Vers2 having different levels to the cell string CS of the memory cell through the bit line BL and the source line SL, respectively. Therefore, a semiconductor memory device having improved reliability may be provided.

Figure 10:
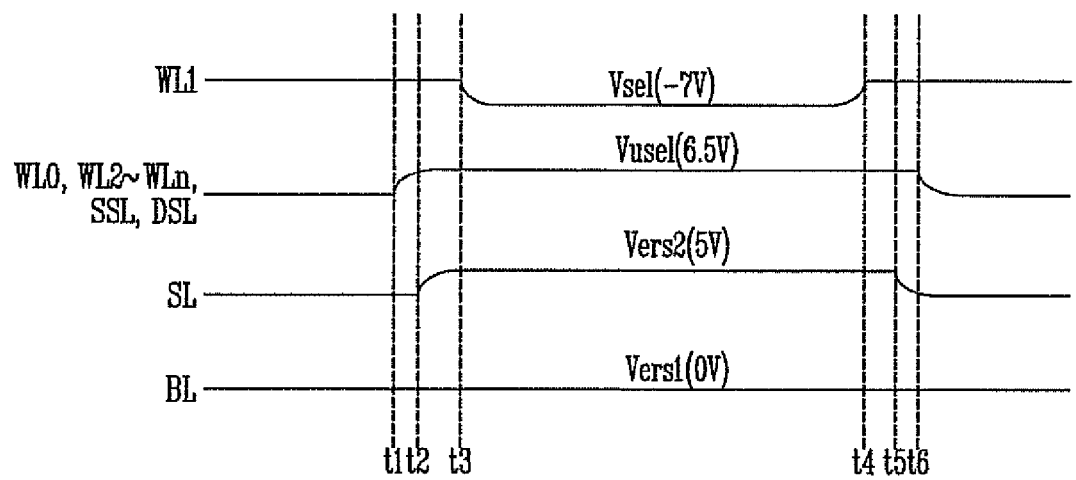
FIG. 10 is a timing diagram illustrating the voltages applied to the cell string under the bias conditions of FIG. 8.

FIG. 10 is a timing diagram illustrating the voltages applied to the cell string CS (see FIGS. 3 and 5) under the bias conditions of FIG. 8.

Referring to FIGS. 3, 5 and 10, the unselected word line voltage Vusel may be applied to the unselected word lines WL0 and WL2 to WLn at a first time t1. For illustration purposes, in FIG. 10, the unselected word line voltage Vusel is 6.5V. The channels CH may be formed in the vertical channel layer SP, and the channels CH may be electrically coupled to the bit line BL or the source line SL.

At a second time t2, the first erase voltage Vers1 may be applied to the bit line BL, and the second erase voltage Vers2 may be applied to the source line SL. For illustration purposes, in FIG. 10, the first erase voltage Vers1 is a ground voltage, and the second erase voltage Vers2 is 5V. Among the channels CH formed in the vertical channel layer SP, the channels CH coupled to the bit line BL may receive the ground voltage and the channels CH coupled to the source line SL may receive a voltage of 5V.

At a third time t3, the selected word line voltage Vsel may be applied to the selected word line WL1. For illustration purposes, in FIG. 10, the selected word line voltage Vsel is −7V. When the selected word line voltage Vsel of −7V is applied to the selected word line WL1, the data stored in the memory cell coupled to the selected word line WL1 may be erased.

At a fourth time t4, the selected word line voltage Vsel may be interrupted. At a fifth time t5, the first and second erase voltages Vers1 and Vers2 may be interrupted. At a sixth time t6, the unselected word line voltage Vusel may be interrupted. As a result, the channels CH formed in the vertical channel layer SP may be removed.

After the sixth time t6, a verifying read operation may be further performed to determine whether or not the erase operation has been performed properly.

FIG. 11 is a table illustrating another example of bias conditions of voltages applied to the row lines RL of FIG. 1. FIG. 12 is a diagram illustrating an erase operation performed in the single cell string CS (see FIGS. 3 and 5) when the voltages satisfying the bias conditions of FIG. 11 are applied thereto.

The bias conditions of FIG. 11 are the same as those of FIG. 8 except for the voltages applied to the bit line BL (see FIGS. 3 and 5) and the source line SL (see FIGS. 3 and 5). Hereinafter, the description for the same bias conditions will be omitted.

Referring to FIGS. 3, 5 and 11, the second erase voltage Vers2 and the first erase voltage Vers1 may be applied to the bit line BL and the source line SL, respectively. Voltages may be interchangeably applied to the bit line BL and the source line SL.

Subsequently, referring to FIG. 12, the channels CH coupled to the bit line BL, among the channels CH formed in the vertical channel layer SP, may receive the second erase voltage Vers2. The channels CH coupled to the source line SL, among the channels CH formed in the vertical channel layer SP, may receive the first erase voltage Vers1. In connection with FIGS. 12 and 13, it is described as an example that the first word line WL1 is selected and the other word lines WL0 and WL2 to WLn are not selected. In substantially the same manner as described in connection with FIG. 9, a lateral field may be generated in the vertical channel layer SP at the position corresponding to the memory cell of the selected word line WL1 due to the first and second erase voltages Vers1 and Vers2. The lateral field may result in generation of hot holes. In addition, when the selected word line voltage Vsel is applied to the selected word line WL1, the data stored in the memory cell of the selected word line WL1 may be erased.

According to an embodiment of the present invention, the data stored in the memory cell of the selected word line WL1 may be efficiently erased by applying the first and second erase voltages Vers1 and Vers2 to the channels CH formed in the vertical channel layer SP.

FIG. 13 is a timing diagram illustrating voltages applied to the cell string CS (see FIGS. 3 and 5) under the bias conditions of FIG. 11. Referring to FIG. 13, at a first time t1, the unselected word line voltage Vusel (for example, a voltage of 6.5V) may be applied to the unselected word lines WL0 and WL2 to WLn. At a second time t2, the second erase voltage Vers2 (for example, a voltage of 5V) may be applied to the bit line BL, and the first erase voltage Vers1 (for example, a voltage of 0V) may be applied to the source line SL. In addition, at a third time t3, the selected word line voltage Vsel (for example, a voltage of −7V) may be applied to the selected word line WL1, and the data in the memory cell coupled to the selected word line WL1 may be erased.

The selected word line voltage Vsel, the first and second erase voltages Vers1 and Vers2 and the unselected word line voltage Vusel may be interrupted at fourth, fifth and sixth times t4, t5 and t6, respectively.

According to an embodiment of the present invention, channels may be formed in the vertical cannel layer SP of a cell string during an erase operation, and first to second erase voltages having different levels may be applied to the vertical cannel layer SP through the bit line and the source line, respectively. In addition, a low voltage may be applied to a selected word line such that the channels may be disconnected in the vertical channel layer SP at a position corresponding to the memory cell of the selected word line and data in the memory cell of the selected word line may be erased. Since hot holes may be formed, and a voltage difference between the selected word line and the channels may not be relatively large, back-tunneling may not occur. Therefore, a semiconductor memory device having improved reliability during an erase operation may be provided.

According to an embodiment of the present invention, a semiconductor memory device improving reliability of an erase operation and a method of operating the same are provided.

What is claimed is:

1. A method of operating a semiconductor memory device, the method comprising:

forming channels in a cell string including a plurality of memory cells stacked over a substrate, wherein the cell string is coupled between a bit line and a source line;

applying first and second erase voltages having different levels to the channels through the bit line and the source line, respectively; and applying a first word line voltage to at least one word line among word lines coupled to the plurality of memory cells.

2. The method of claim 1, wherein the forming of the channels in the cell string comprises applying a second word line voltage to other word lines than the at least one word line to form the channels.

3. The method of claim 2, wherein the second word line voltage is higher than the first wore line voltage to couple first memory cells between the bit line and a memory cell coupled to the at least one word line, couple second memory cells between the source line and the memory cell, and electrically separate the memory cell from the other memory cells.

4. The method of claim 2, wherein the forming of the channels in the cell string further comprises:

applying the second word line voltage to a drain select transistor disposed between the memory cells and the bit line to electrically couple the cell string to the bit line.

5. The method of claim 2, wherein the fanning of the channels in the cell string further comprises:

applying the second word line voltage to a source select transistor disposed between the memory cells and the source line to electrically couple the cell string to the source line.

6. The method of claim 1, wherein the applying of the first word line voltage to the at least one word line comprises erasing data in a memory cell coupled to the at least one word line.

7. The method of claim 1, wherein the first erase voltage has a level lower than a level of the second erase voltage.

8. The method of claim 1, wherein the first erase voltage has a level higher than a level of the second erase voltage.

9. A semiconductor memory device, comprising:

a memory cell array including a cell string coupled between a bit line and a source line, wherein the cell string comprises a plurality of memory cells stacked over a substrate;

a voltage generator configured to generate first and second erase voltages having different levels; and a peripheral circuit configured to form channels in the cell string and apply the first and second erase voltages to the channels through the bit line and the source line, respectively, during an erase operation.

10. The semiconductor memory device of claim 9, wherein the voltage generator is configured to generate a first and second word line voltages, wherein the peripheral circuit includes a row decoder configured to apply the first word line voltage to a word line of at least one of the memory cells and the second word line voltage to word lines of the other memory cells, during the erase operation.

11. The semiconductor memory device of claim 10, wherein the row decoder is configured to electrically couple first memory cells between the bit line and the at least one memory cell and electrically couple second memory cells between the source line and the at least one memory cell.

12. The semiconductor memory device of claim 10, wherein the row decoder is configured to electrically separate the at least one memory cell from the other memory cells and erase data in the at least one memory cell.

13. The semiconductor memory device of claim 10, wherein the second word line voltage is higher than the first wore line voltage.

14. The semiconductor memory device of claim 9, wherein the cell string further comprises a drain select transistor disposed between the plurality of memory cells and the bit line and a source select transistor disposed between the plurality of the memory cells and the source line, and wherein the drain select transistor and the source select transistor are turned on and electrically couple the cell string to the bit line and the source line.

15. The semiconductor memory device of claim 9, the first and second erase voltages have different levels.

16. A method of operating a semiconductor memory device, the method comprising:

applying a first word line voltage to at least one of a plurality of memory cells stacked between a bit line and a source line over a substrate;

applying a second word line voltage higher than the first word line voltage to the other memory cells; and applying first and second erase voltages having different levels to channels of the plurality of memory cells through the bit line and the source line, respectively.

17. The method of claim 16, wherein, in the applying of the first word line voltage to the at least one memory cell, the at least one memory cell is electrically separated from the other memory cells.

18. The method of claim 16, wherein in the applying of the second word line voltage to the other memory cells, first memory cells between the bit line and the at least one memory cell are coupled, and second memory cells between the source line and the at least one memory cell are coupled.

19. The method of claim 18, wherein the applying of the second word line voltage to the other memory cells further comprises:

applying the second word line voltage to a drain select transistor disposed between the bit line and the memory cells to electrically couple the bit line and the first memory cells; and applying the second word line voltage to a source select transistor disposed between the source line and the memory cells to electrically couple the source line and the second memory cells.

* * * * *